(12) United States Patent
Muraki et al.

(10) Patent No.: US 8,692,218 B2
(45) Date of Patent: Apr. 8, 2014

(54) CHARGED PARTICLE BEAM EXPOSURE APPARATUS

(75) Inventors: Masato Muraki, Inagi (JP); Haruo Yoda, Tokyo (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 864 days.

(21) Appl. No.: 11/762,180

(22) Filed: Jun. 13, 2007

(65) Prior Publication Data

US 2008/0067402 A1    Mar. 20, 2008

(30) Foreign Application Priority Data

Jun. 20, 2006   (JP) ................................. 2006-169797

(51) Int. Cl.
 *G01B 15/00* (2006.01)

(52) U.S. Cl.
 USPC ..................... 250/492.3; 250/492.1; 250/397; 250/396 R

(58) Field of Classification Search
 USPC ...... 250/492.1–492.3, 491.1, 396 R–396 ML
 See application file for complete search history.

(56) References Cited

U.S. PATENT DOCUMENTS

| | | | | |
|---|---|---|---|---|
| 5,049,221 A | * | 9/1991 | Wada et al. | 156/151 |
| 5,396,077 A | | 3/1995 | Sohda et al. | |
| 5,432,352 A | * | 7/1995 | van Bavel | 250/492.21 |
| 5,863,682 A | * | 1/1999 | Abe et al. | 430/30 |
| 5,981,961 A | * | 11/1999 | Edwards et al. | 250/492.21 |
| 6,166,387 A | * | 12/2000 | Muraki et al. | 250/492.2 |
| 6,835,937 B1 | * | 12/2004 | Muraki et al. | 250/396 R |
| 6,855,929 B2 | * | 2/2005 | Kimba et al. | 850/9 |
| 6,870,170 B1 | * | 3/2005 | Farley et al. | 250/492.21 |
| 7,282,427 B1 | * | 10/2007 | Murrell et al. | 438/535 |
| 7,462,848 B2 | | 12/2008 | Parker | |
| 2002/0177056 A1 | * | 11/2002 | Ogino et al. | 430/30 |
| 2003/0094584 A1 | * | 5/2003 | Yui et al. | 250/492.22 |
| 2004/0036846 A1 | * | 2/2004 | Nishi | 355/18 |
| 2004/0149933 A1 | * | 8/2004 | Kawamura | 250/492.1 |
| 2005/0006601 A1 | * | 1/2005 | Muraki et al. | 250/492.22 |
| 2006/0060775 A1 | * | 3/2006 | Sakakibara et al. | 250/307 |

FOREIGN PATENT DOCUMENTS

| | | |
|---|---|---|
| JP | 03-091228 A | 4/1991 |
| JP | 04-116915 A | 4/1992 |
| JP | 2005-032838 | 2/2005 |
| JP | 2006-019437 A | 1/2006 |
| JP | 2006019437 A * | 1/2006 |

OTHER PUBLICATIONS

The above references were cited in a Apr. 6, 2012 Japanese Office Action, without an English Translation, that issued in Japanese Patent Application No. 2006-169797.

(Continued)

*Primary Examiner* — Andrew Smyth

(74) *Attorney, Agent, or Firm* — Cowan, Liebowitz & Latman, P.C.

(57) ABSTRACT

An exposure apparatus which draws a pattern on a substrate with a charged particle beam is disclosed. The exposure apparatus includes a blanker which controls, in accordance with a dose pattern including a plurality of pulses, whether to allow a charged particle beam to strike the substrate, and a controller which executes calibration for correcting the dose pattern to obtain a pattern having the target line width.

10 Claims, 20 Drawing Sheets

(56) References Cited

OTHER PUBLICATIONS

The above references were cited in a Jul. 9, 2009 US Notice of Allowance that issued in related U.S. Appl. No. 11/762,182.

The above reference was cited in a Oct. 21, 2011 Japanese Office Action, without an English Translation, that issued in Japanese Patent Application No. 2006-169797.

* cited by examiner

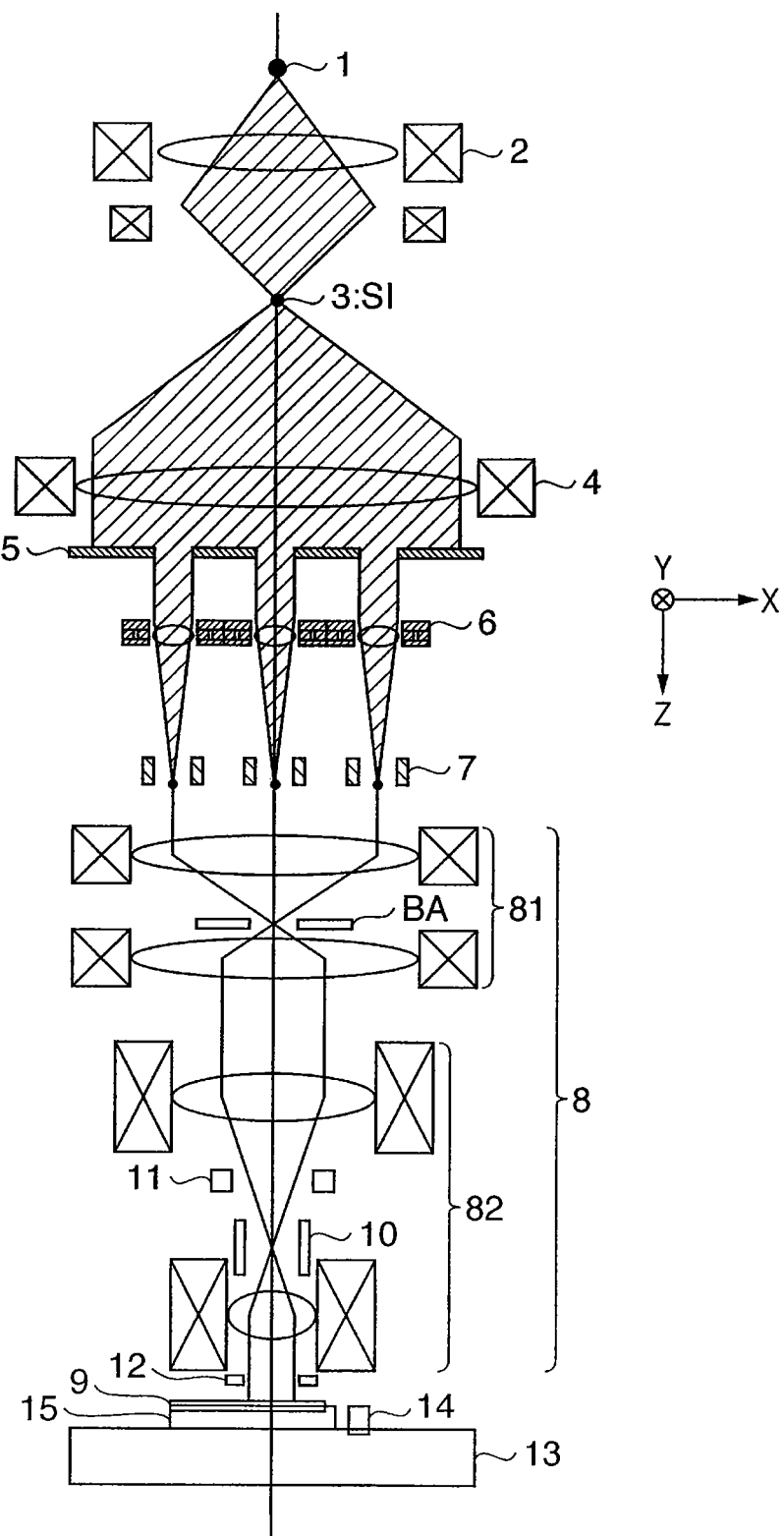
F I G. 1

FIG. 4

| DOSE PATTERN | FIRST SHOT | SECOND SHOT | THIRD SHOT | FOURTH SHOT | UNIT |
|---|---|---|---|---|---|
| 1 | 8.0 | 8.0 | 8.0 | 0.0 | (ns) |
| 2 | 8.0 | 8.0 | 8.0 | 0.5 | (ns) |
| 3 | 8.0 | 8.0 | 8.0 | 1.0 | (ns) |
| 4 | 8.0 | 8.0 | 8.0 | 1.5 | (ns) |
| 5 | 8.0 | 8.0 | 8.0 | 2.0 | (ns) |
| 6 | 8.0 | 8.0 | 8.0 | 2.5 | (ns) |
| 7 | 8.0 | 8.0 | 8.0 | 3.0 | (ns) |
| 8 | 8.0 | 8.0 | 8.0 | 3.5 | (ns) |
| 9 | 8.0 | 8.0 | 8.0 | 4.0 | (ns) |
| 10 | 8.0 | 8.0 | 8.0 | 4.5 | (ns) |
| 11 | 8.0 | 8.0 | 8.0 | 5.0 | (ns) |
| 12 | 8.0 | 8.0 | 8.0 | 5.5 | (ns) |
| 13 | 8.0 | 8.0 | 8.0 | 6.0 | (ns) |
| 14 | 8.0 | 8.0 | 8.0 | 6.5 | (ns) |
| 15 | 8.0 | 8.0 | 8.0 | 7.0 | (ns) |
| 16 | 8.0 | 8.0 | 8.0 | 7.5 | (ns) |

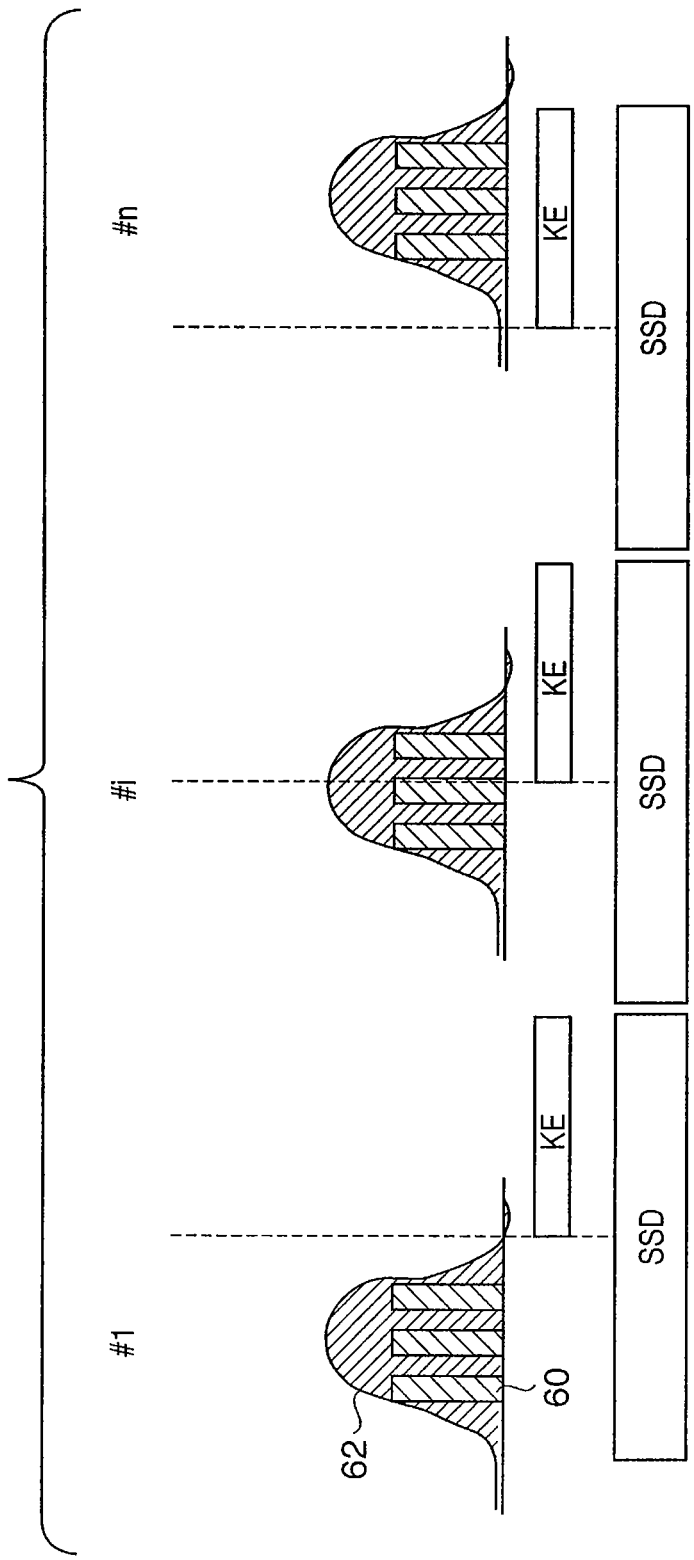

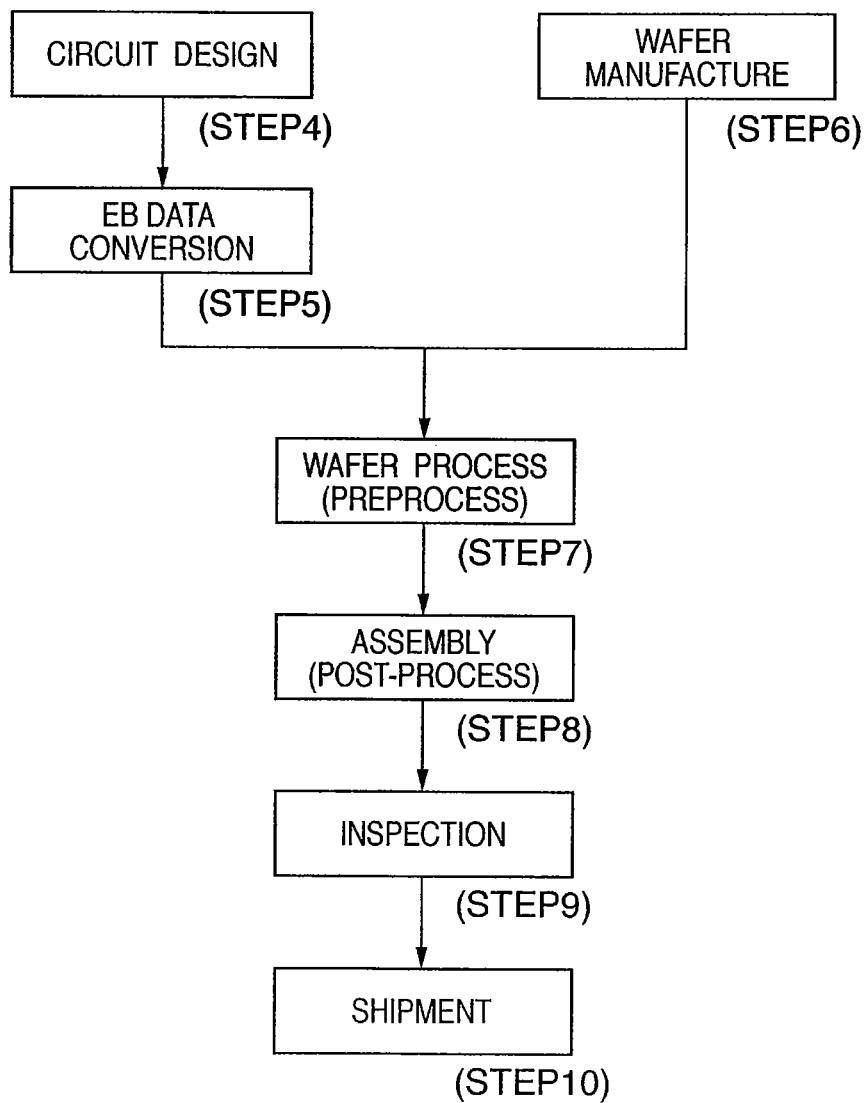
F I G. 11

F I G. 14
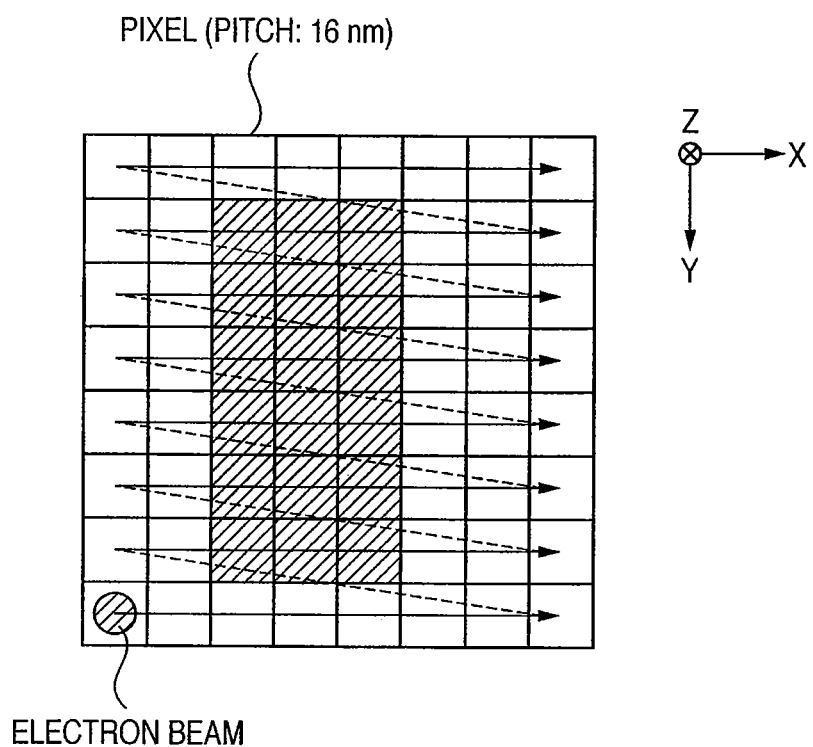

FIG. 16
PRIOR ART

| SHOT NUMBER | -1 | 0 | 1 | 2 | 3 | 4 | 5 | 6 | (SHOT) |
|---|---|---|---|---|---|---|---|---|---|
| MODEL NUMBER | | | | | | | | | |
| 1 | 0.0 | 0.0 | 6.5 | 8.0 | 8.0 | 0.0 | 0.0 | 0.0 | (nsec) |
| 2 | 0.0 | 0.0 | 6.0 | 8.0 | 8.0 | 0.5 | 0.0 | 0.0 | (nsec) |
| 3 | 0.0 | 0.0 | 5.5 | 8.0 | 8.0 | 1.0 | 0.0 | 0.0 | (nsec) |
| 4 | 0.0 | 0.0 | 5.0 | 8.0 | 8.0 | 1.5 | 0.0 | 0.0 | (nsec) |
| 5 | 0.0 | 0.0 | 4.5 | 8.0 | 8.0 | 2.0 | 0.0 | 0.0 | (nsec) |
| 6 | 0.0 | 0.0 | 4.0 | 8.0 | 8.0 | 2.5 | 0.0 | 0.0 | (nsec) |
| 7 | 0.0 | 0.0 | 3.5 | 8.0 | 8.0 | 3.0 | 0.0 | 0.0 | (nsec) |
| 8 | 0.0 | 0.0 | 3.0 | 8.0 | 8.0 | 3.5 | 0.0 | 0.0 | (nsec) |
| 9 | 0.0 | 0.0 | 2.5 | 8.0 | 8.0 | 4.0 | 0.0 | 0.0 | (nsec) |
| 10 | 0.0 | 0.0 | 2.0 | 8.0 | 8.0 | 4.5 | 0.0 | 0.0 | (nsec) |
| 11 | 0.0 | 0.0 | 1.5 | 8.0 | 8.0 | 5.0 | 0.0 | 0.0 | (nsec) |
| 12 | 0.0 | 0.0 | 1.0 | 8.0 | 8.0 | 5.5 | 0.0 | 0.0 | (nsec) |
| 13 | 0.0 | 0.0 | 0.5 | 8.0 | 8.0 | 6.0 | 0.0 | 0.0 | (nsec) |
| 14 | 0.0 | 0.0 | 0.0 | 8.0 | 8.0 | 6.5 | 0.0 | 0.0 | (nsec) |
| 15 | 0.0 | 0.0 | 0.0 | 7.5 | 8.0 | 7.0 | 0.0 | 0.0 | (nsec) |
| 16 | 0.0 | 0.0 | 0.0 | 7.0 | 8.0 | 7.5 | 0.0 | 0.0 | (nsec) |

CHARGED PARTICLE BEAM EXPOSURE APPARATUS

BACKGROUND OF THE INVENTION

1. Field of the Invention

The present invention relates to a charged particle beam exposure apparatus and, more particularly, to an exposure apparatus which draws a pattern on a substrate with a charged particle beam, a method of measuring the line width of the pattern formed by the exposure apparatus, and a device manufacturing method using the exposure apparatus.

2. Description of the Related Art

There has conventionally, generally been used a technique which can manufacture a device such as a semiconductor integrated circuit having a micropattern and high integration degree by raster-scanning a substrate with, e.g., a charged particle beam.

For example, Japanese Patent Laid-Open No. 2005-32838 discloses a charged particle beam drawing method of performing adjustment to make the dimension, in the raster scanning direction, of a charged particle beam on the substrate smaller than that in a direction perpendicular to the raster scanning direction. This method is applicable to an electron beam exposure apparatus which outputs a raster scanning type electron beam.

FIG. 13 is an explanatory view for explaining an arrangement example of a conventional raster scanning type electron beam exposure apparatus. This apparatus causes an electron source S to emit an electron beam. The electron beam forms an image of the electron source S via an electron lens L1. The image of the electron source S is reduced and projected onto a wafer W via a reduction electro-optic system including electron lenses L2 and L3.

A blanker B is an electro-static deflector positioned at the image of the electron source S formed by the electron lens L1. The blanker B controls whether to allow the electron beam to strike the wafer W. In a case that the blanker B does not allow the electron beam to strike the wafer W, it deflects the electron beam and a blanking aperture BA positioned at the pupil of the reduction electro-optic system shields the deflected electron beam. In addition, an electro-static deflector DEF deflects the electron beam to scan the wafer W with it.

A method of drawing a pattern on the wafer W by raster scanning will be explained with reference to FIG. 14. FIG. 14 is an explanatory view for explaining a method of drawing a pattern on the wafer W by raster scanning. In one example in which a 48-nm isolated line is to be drawn as a pattern, a drawing region is divided into pixels (pixel pitch=16 nm).

While the deflector DEF deflects the electron beam to scan the drawing region in the X direction, the blanker B controls the electron beam to strike each pixel of the pattern. After completing scanning in the X direction, the electron beam steps in the Y direction. The blanker B controls irradiation of the electron beam with respect to the drawing region to draw the pattern while scanning it in the X direction again.

Line width control of a line pattern will be explained with reference to FIGS. 15A and 15B. FIGS. 15A and 15B are explanatory views (graphs) for explaining line width control of a line pattern. FIG. 15A shows an example of line width control in drawing, e.g., a 48-nm isolated line. The formation of, e.g., a line having a width of 48 nm uses three pixels, the doses (exposure times) of which are equalized.

FIG. 15B exemplifies a case in which a 45-nm isolated line, for example, is drawn. To form a pattern having a line width of 45 nm, three pixels are used like the 48-nm isolated line. However, the dose (exposure time) of a pixel positioned at the line edge is reduced to, e.g., 13/16 that of the other pixels. That is, the dose of a pixel positioned at the line edge is made variable to control a line width (line width imparting amount) that the pixel imparts to the line pattern, thereby forming a pattern having a target line width.

However, in drawing a 45-nm isolated line by pattern line width control, the dose (exposure time) of a pixel positioned at the line edge need not always be 13/16 that of the other pixels.

That is, if 1-nm grid patterns are designed, sixteen types of dose patterns are possible. As shown in FIG. 16, assuming that the exposure cycle is 10 ns and the maximum exposure time is 8 ns, there are sixteen types of dose patterns. All the dose patterns are required to have a line width of 45 nm and to move in steps of 1 nm.

Unfortunately, it is generally difficult to form a required pattern on the wafer with high accuracy.

SUMMARY OF THE INVENTION

According to a preferred embodiment of the present invention, it is possible to control with high accuracy a line width of a pattern formed by drawing.

According to a first aspect of the present invention, an exposure apparatus which draws a pattern on a substrate with a charged particle beam is disclosed The exposure apparatus comprises a blanker configured to control, in accordance with a dose pattern including a plurality of pulses, whether to allow a charged particle beam to strike the substrate; and a controller configured to execute calibration for correcting the dose pattern to obtain a pattern having a target line width.

According to a second aspect of the present invention, an exposure method of causing an exposure apparatus which draws a pattern on a substrate with a charged particle beam to expose the substrate to light is disclosed. The exposure apparatus includes a blanker which controls, in accordance with a dose pattern including a plurality of pulses, whether to allow a charged particle beam to strike the substrate. The control method comprises steps of determining a correction function to correct the dose pattern to obtain a pattern having a target line width, and correcting the dose pattern based on the correction function, and drawing a pattern on the substrate with the charged particle beam while controlling the blanker in accordance with the corrected dose pattern.

Further features of the present invention will become apparent from the following description of exemplary embodiments with reference to the attached drawings.

BRIEF DESCRIPTION OF THE DRAWINGS

FIG. 1 is an explanatory view for explaining the outline of the main part of an electron beam exposure apparatus according to an embodiment of the present invention;

FIG. 4 is a table illustrating dose patterns according to the embodiment of the present invention;

FIG. 6 is a graph illustrating the intensity distributions of electron beams which strike a semiconductor detector according to the embodiment of the present invention;

FIG. 11 is a flowchart for explaining the device manufacture using the exposure apparatus according to the embodiment of the present invention;

FIG. 14 is an explanatory view for explaining the pixel intensity distribution obtained by conventional raster scanning;

FIG. 16 is an explanatory table for explaining a conventional dose pattern;

DESCRIPTION OF THE EMBODIMENTS

Figure 2:
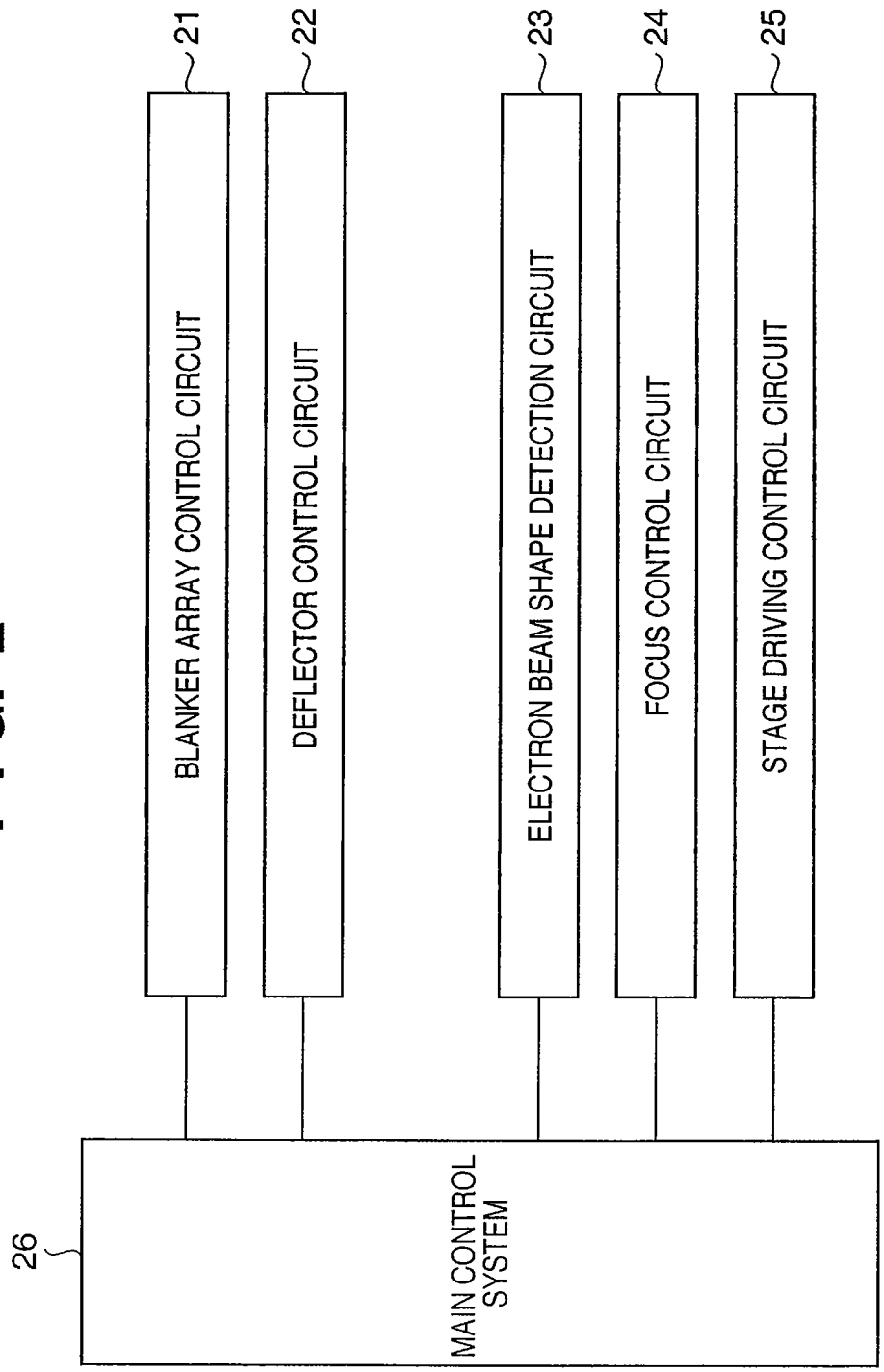
FIG. 2 is a block diagram showing the system configuration of the exposure apparatus according to the embodiment of the present invention.

An embodiment of the present invention will be described below with reference to the accompanying drawings.

This embodiment exemplifies a charged particle beam exposure apparatus as an electron beam exposure apparatus. A charged particle beam here includes an ion beam in addition to an electron beam. The present invention is not limited to an exposure apparatus using an electron beam, and is applicable to an exposure apparatus using an ion beam.

<Explanation of Constituent Components of Electron Beam Exposure Apparatus>

FIG. 1 is a schematic view showing the outline of the main part of an electron beam exposure apparatus according to an embodiment of the present invention. Referring to FIG. 1, an electron beam emitted by an electron gun (not shown) forms a crossover image. This crossover image will be referred to as an electron source 1 hereinafter. The electron beam emitted by the electron source 1 forms an image (SI) 3 of the electron source 1 via a beam shaping optical system 2.

A collimator lens 4 collimates the electron beam from the image SI 3 into an almost parallel electron beam. The almost parallel electron beam illuminates an aperture array 5 having a plurality of apertures.

The aperture array 5 has a plurality of apertures to divide the electron beam into a plurality of electron beams. Each of the plurality of electron beams divided by the aperture array 5 forms an intermediate image of the image SI 3 via an electro-static lens array 6 having a plurality of electro-static lenses. A blanker array 7 having a plurality of blankers serving as electro-static deflectors is arranged on the side on which the intermediate images are formed.

A reduction electro-optic system 8 including two-stage symmetrical magnetic doublet lenses 81 and 82 is arranged downstream of the side on which the intermediate images are formed. The reduction electro-optic system 8 projects intermediate images onto a wafer (substrate) 9. At this time, the electron beam deflected by the blanker array 7 does not strike the wafer 9 because a blanking aperture BA shields it. On the other hand, the electron beam which is not deflected by the blanker array 7 strikes the wafer 9 because the blanking aperture BA does not shield it.

The lower-stage doublet lens 82 incorporates a deflector 10 for simultaneously displacing a plurality of electron beams to target positions in the X and Y directions, and a focus coil 12 for simultaneously adjusting the focus of a plurality of electron beams.

An X-Y stage 13 supports the wafer 9 and can move in the X and Y directions perpendicular to the optical axis. An electro-static chuck 15 and semiconductor detector (SSD) 14 are arranged on the X-Y stage 13. The electro-static chuck 15 chucks the wafer 9. The semiconductor detector SSD 14 has a knife edge on the incident side of an electron beam and measures the electron beam.

<Explanation of System Configuration and Drawing Method>

FIG. 2 is a block diagram showing the system configuration of the exposure apparatus according to the preferred embodiment of the present invention.

A blanker array control circuit 21 individually controls the plurality of blankers which form the blanker array 7. With this operation, the blanker array control circuit 21 individually controls whether to allow an electron beam to strike the wafer or semiconductor detector (detector) 14. A deflector control circuit 22 controls the deflector 10. An electron beam shape detection circuit 23 processes the signal from the semiconductor detector 14.

A focus control circuit 24 controls the focus position of the reduction electro-optic system 8 by adjusting the focal length of the focus coil 12. A stage driving control circuit 25 controls driving of the X-Y stage 13 in cooperation with laser interferometers (not shown) which detect the position of the X-Y stage 13.

A main control system (controller) 26 is, e.g., a CPU or MPU which controls the plurality of control circuits and manages the overall electron beam exposure apparatus.

Figure 3:
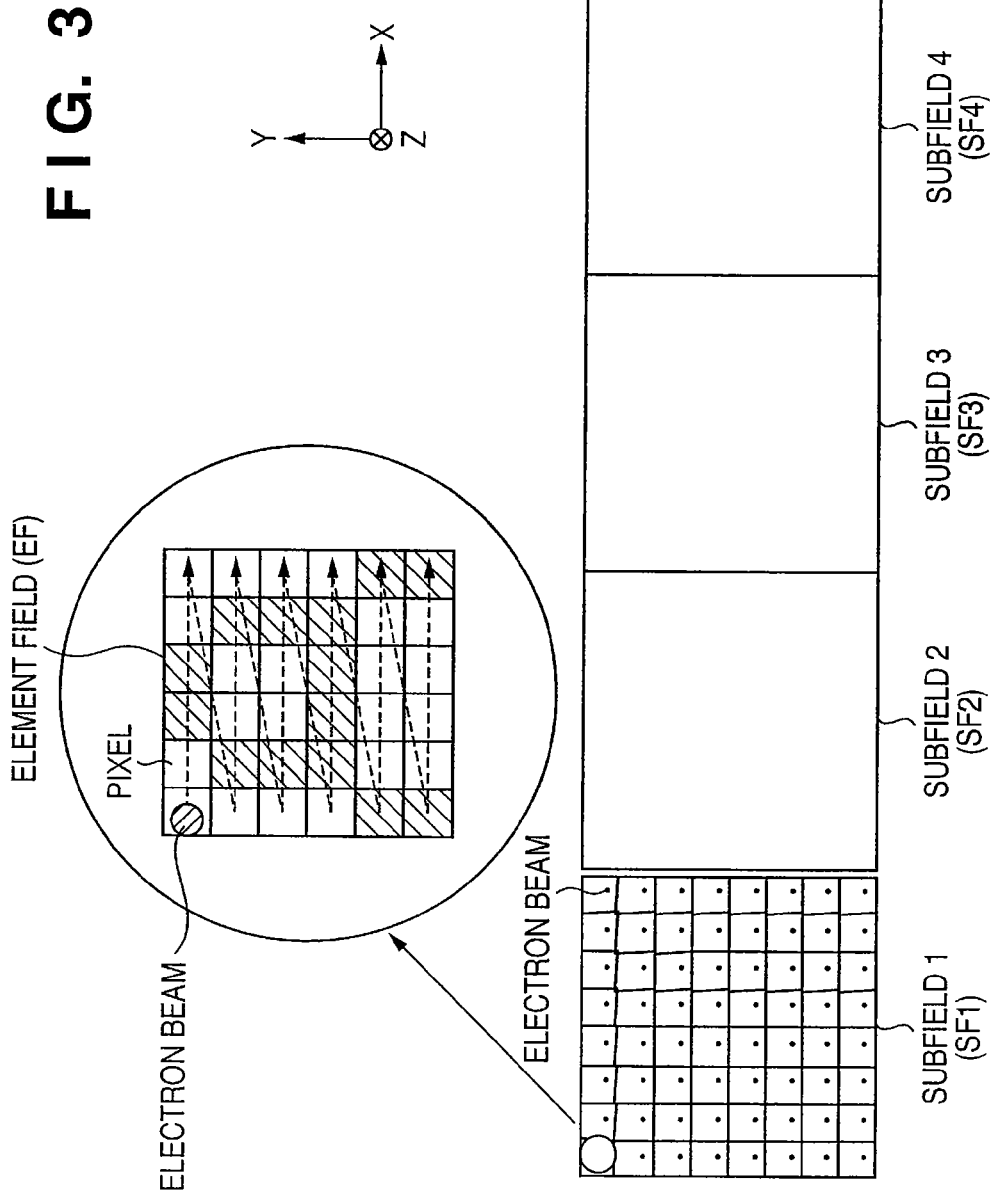
FIG. 3 is an explanatory view for explaining a drawing method (charged particle beam drawing method) according to the embodiment of the present invention.

FIG. 3 is an explanatory view for explaining a drawing method (charged particle beam drawing method) according to the preferred embodiment of the present invention.

In the drawing method of this example, the main control system 26 instructs the deflector control circuit 22 to deflect a plurality of electron beams. The main control system 26 also instructs the blanker array control circuit 21 to individually turn on/off the blankers of the blanker array 7 based on a command value corresponding to a pixel to be drawn on the wafer 9.

More specifically, the main control system 26 instructs, based on exposure control data, the deflector control circuit 22 so that the deflector 10 raster-scans and exposes a corresponding element field EF on the wafer 9, as shown in FIG. 3.

The element fields EF of the respective electron beams are set to be two-dimensionally adjacent to each other. As a result, subfields (SF1, SF2, SF3, . . . ) formed by the arrays of a plurality of element fields EF are simultaneously exposed.

After exposing the subfield SF1, the main control system 26 instructs the deflector control circuit 22 so that the deflector 10 deflects the plurality of electron beams, i.e., exposes the next subfield SF2, including moving the pattern drawing position in the direction in which the line width is measured.

As the subfield changes upon deflection, the aberration when each electron beam is reduced and projected via the reduction electro-optic system 8 also changes.

<Explanation of Dose Correction Amount>

Figure 5A:
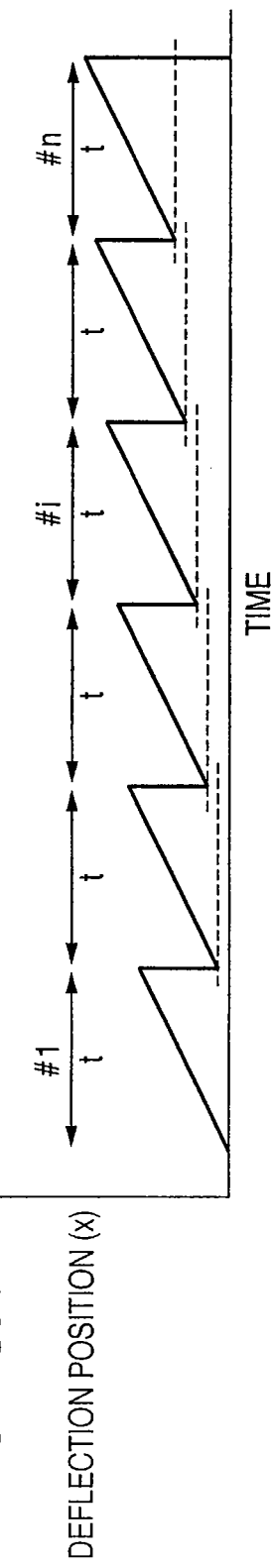
FIGS. 5A and 5B are explanatory charts for explaining dose patterns and a deflection position coordinate to measure the actual line width of each dose pattern according to the embodiment of the present invention.
Figure 5B:
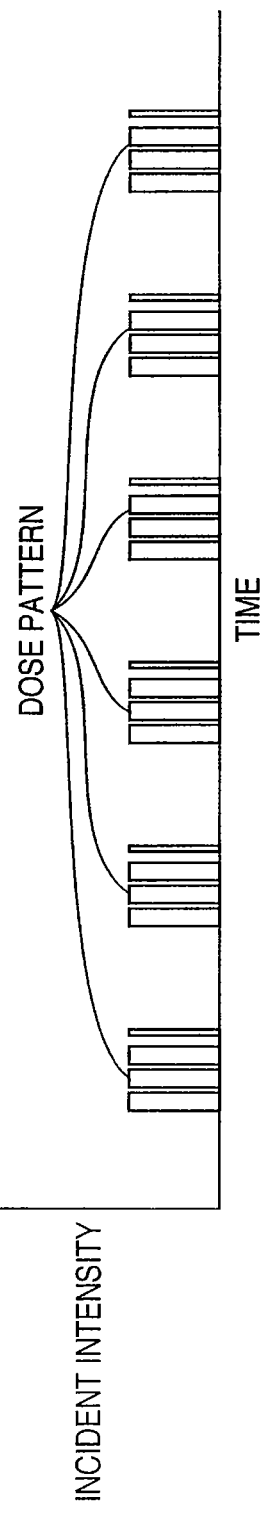

FIG. 5A is a chart showing the deflection position (the position at which an electron beam strikes the wafer or semiconductor detector) of an electron beam. As described above, the deflector 10 controls the position (i.e., the deflection of an electron beam) at which an electron beam strikes the wafer or semiconductor detector 14. FIG. 5B is a chart showing an example of dose patterns. FIGS. 5A and 5B share a common time axis and illustrate the relationship between the deflection position and the dose pattern.

In this embodiment, as illustrated in FIG. 5A, the blanker array 7 controls irradiation of the electron beam with respect to the semiconductor detector 14 in accordance with the dose pattern as illustrated in FIG. 5B while controlling the deflection of the electron beam. On the basis of the output from the semiconductor detector 14, an electron beam intensity distribution formed by the electron beam which strikes a detection surface of the semiconductor detector 14 is detected.

This electron beam intensity distribution has a strong correlation with the width of a latent image pattern formed on the resist by drawing the device pattern on the resist on the wafer with an electron beam, and further with the width of a resist pattern formed by developing the latent image pattern. That is, the width of a portion having a value equal to or higher than the slice level in an electron beam intensity distribution formed on the detection surface of the semiconductor detector in accordance with the dose pattern is equivalent to the width of a latent image pattern formed on the resist in accordance with the dose pattern, and further the width of a resist pattern obtained by developing the latent image pattern.

FIG. 6 is an explanatory graph for explaining the dose pattern of an electron beam which strikes the semiconductor detector (SSD) 14. Rectangles 60 indicate individual pulses which form a dose pattern. Convex curves 62 indicate an electron beam intensity distribution formed on the detection surface of the semiconductor detector 14 in accordance with the dose pattern. This electron beam intensity distribution can be measured in the following way.

At a deflection time t, the deflector 10 moves, from the scanning start position in the scanning direction, the position at which the electron beam strikes the detection surface of the semiconductor detector 14. During this time, the semiconductor detector 14 detects the amount of electron beam which strikes it. At the next deflection time t, the deflector 10 moves, from the changed scanning start position in the scanning direction, the position at which the electron beam strikes the detection surface of the semiconductor detector 14. During this time, the semiconductor detector 14 detects the amount of electron beam which strikes it. The above-described process is repeated.

The amount of electron beam detected by the semiconductor detector 14 in every scanning is the amount (a value obtained by integrating the intensity of the electron beam over time) of electron beam which has struck it without being shielded by the knife edge KE arranged on it. An electron beam scans the semiconductor detector 14 in accordance with the same dose pattern plural times while changing the scanning start position. Calculating the change amount of the output (electron beam amount) from the semiconductor detector 14 obtained by scanning makes it possible to attain an electron beam intensity distribution.

Executing the above operation for a plurality of dose patterns makes it possible to attain the relationship between a dose pattern and the line width of a resist pattern formed in accordance with it. That is, according to this embodiment, it is possible to attain the relationship between a dose pattern and the line width of a resist pattern formed in accordance with it, without developing the resist.

Figure 7:
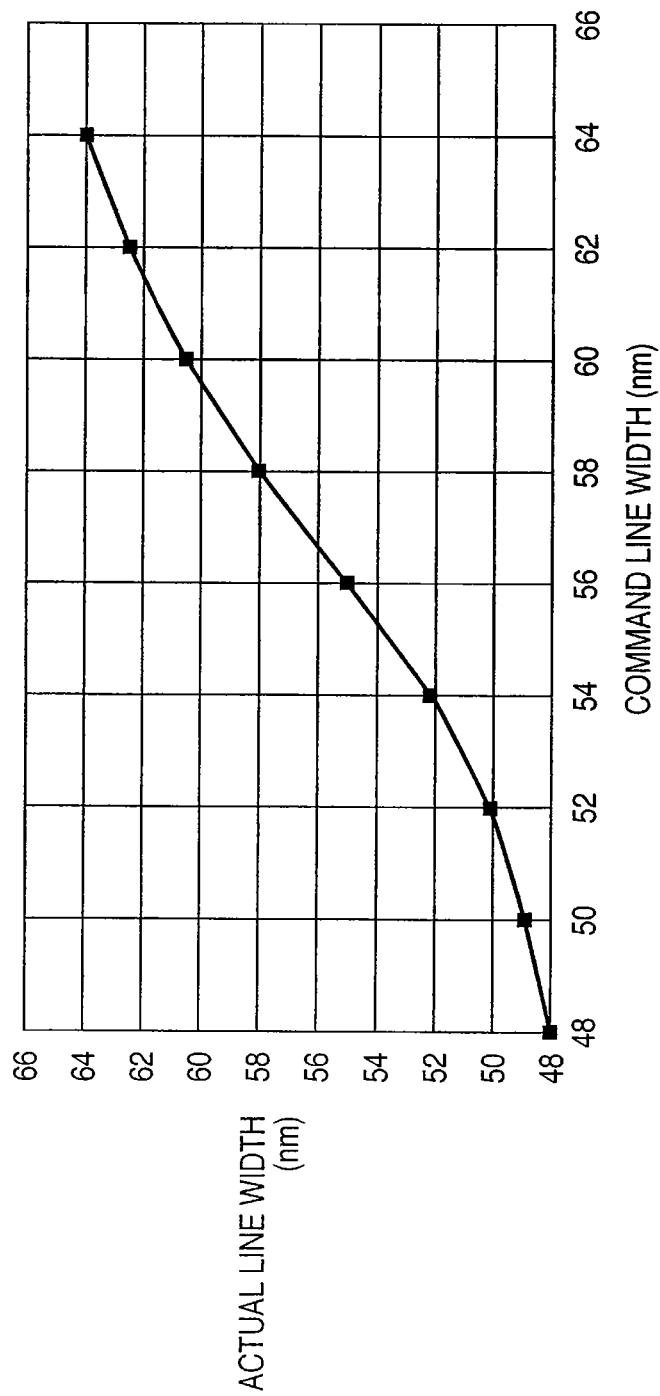
FIG. 7 is an explanatory graph showing the relationship between an actual line width and a command line width (dose pattern) according to the embodiment of the present invention.

FIG. 7 is a graph illustrating the relationship between a dose pattern and the line width of a resist pattern formed in accordance with it. The abscissa of FIG. 7 indicates a command line width (target line width) in line width measurement. The ordinate of FIG. 7 indicates the width of an actually formed line. The command line width is designated in a command sent from the main control system 26 to the blanker array control circuit 21. The command line width corresponds to the dose pattern as illustrated in FIG. 4. FIG. 4 illustrates sixteen types of dose patterns each of which is formed by four pulses ("first shot", "second shot", "third shot", and "fourth shot"). In this embodiment, a time period of 1 ns corresponds to a line width of 2 nm. For example, for dose pattern 1, the electron beam strikes the wafer or semiconductor detector 14 for a total of 24 ns and the command line width is 48 nm.

Figure 17:
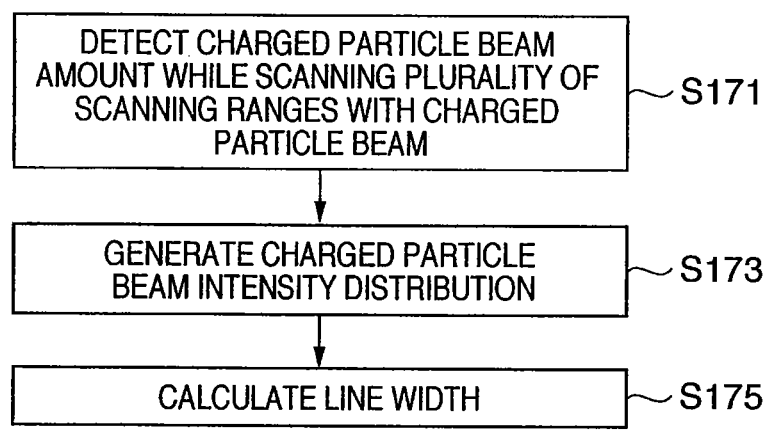
FIG. 17 is a flowchart for explaining a line width measurement sequence according to the preferred embodiment of the present invention.

FIG. 17 is a flowchart for explaining a line width measurement sequence according to the preferred embodiment of the present invention. Line width measurement is performed under the control of the main control system 26. In step S171, the main control system 26 sends a command to the deflector control circuit 22 to control the deflector 10 to scan the semiconductor detector 14 with an electron beam (charged particle beam). This scanning can be done in accordance with a deflection control profile shown in, e.g., FIG. 5A. This profile is used to gradually change the scanning range (deflection range). For example, this profile is used to change the scanning start position in the scanning direction little by little every time the electron beam scans the semiconductor detector 14. A series of plural times of scanning processes use the same dose pattern.

Every time the electron beam scans the semiconductor detector 14 as described above, it detects the amount of electron beam (charged particle beam) which strikes it under the control of the main control system 26. Referring to FIGS. 5A and 6, #1, #i, and #n respectively indicate the first, i-th, and n-th scanning processes with respect to the semiconductor detector 14 with the electron beam.

That is, in step S171, the semiconductor detector 14 detects the amount of electron beam (charged particle beam) which strikes it while the semiconductor detector 14 is scanned with the electron beam (charged particle beam) for each of a plurality of scanning ranges on the semiconductor detector 14.

In step S173, the main control system 26 calculates the change amount of the output, i.e., electron beam (charged particle beam) from the semiconductor detector 14 obtained by the plural times of scanning processes in step S171, to obtain an electron beam (charged particle beam) intensity distribution.

In step S175, the width of a portion having a value equal to or higher than the slice level in the electron beam (charged particle beam) intensity distribution obtained in step S173 is calculated. That is, the line width of a resist pattern to be formed by drawing a pattern on the resist in accordance with the dose pattern used in step S171 is calculated. The slice level can be determined depending on the resist and development condition.

Each of the plurality of dose patterns as illustrated in FIG. 4 undergoes the process shown in FIG. 17. This makes it possible to obtain the relationship between the dose pattern as illustrated in FIG. 7 and the line width of a resist pattern formed in accordance with it.

As illustrated in FIG. 7, an actual line width monotonically increases as the command line width (in this example, the sum total of the pulse widths of a dose pattern) increases.

Figure 8:
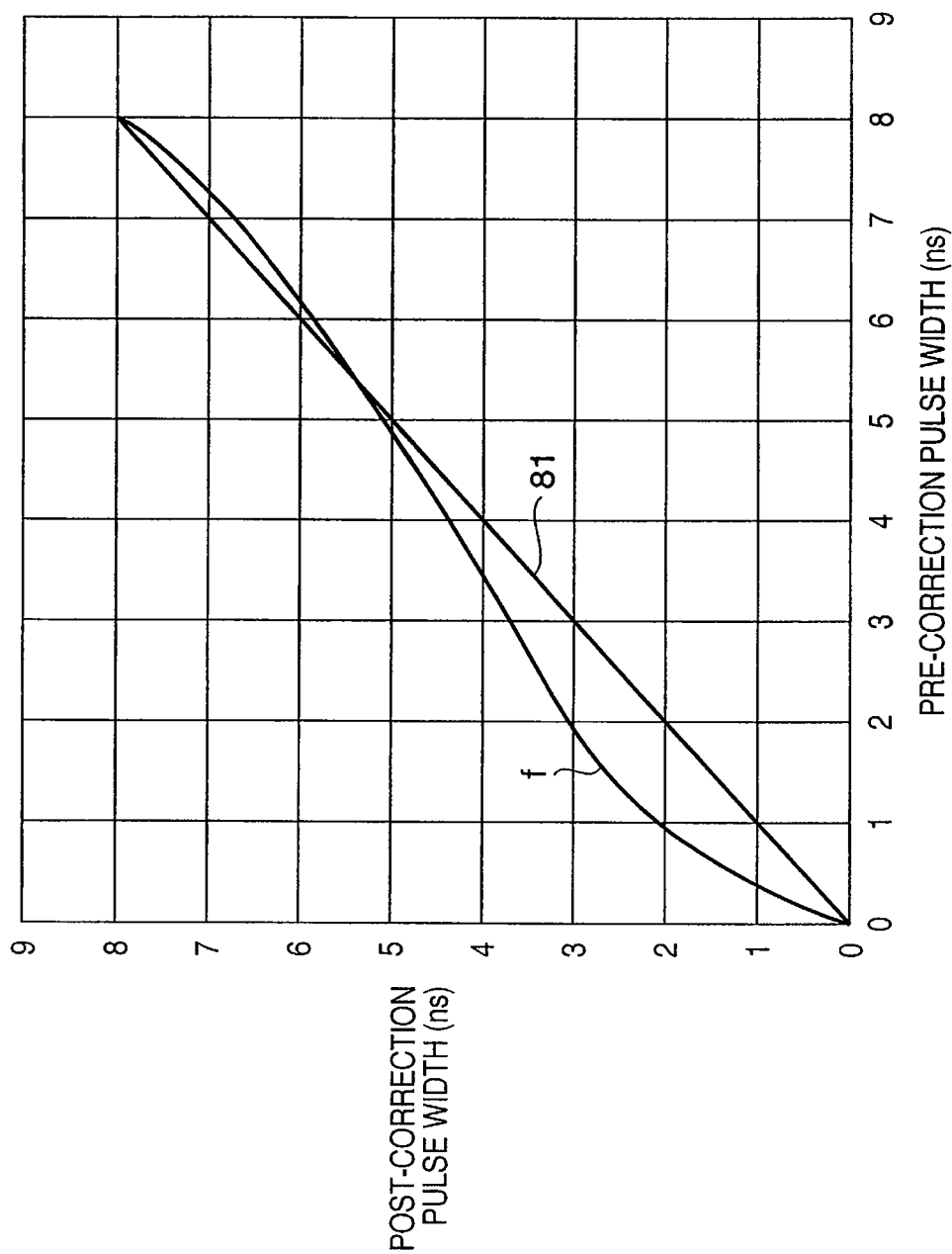
FIG. 8 is a graph illustrating a correction function of the pulse width (dose command value) according to the embodiment of the present invention.

FIG. 8 is a graph illustrating a correction function f generated on the basis of the measurement result (the relationship between a dose pattern and the line width of a resist pattern formed in accordance with it) illustrated in FIG. 7. An abscissa D0 indicates the pulse width in case where the width of a pulse forming a dose pattern is assumed to have a linear relationship with the line width of an actually formed resist pattern. This pulse width will be called a pre-correction pulse width hereinafter. An ordinate D1 indicates the pulse width after the pre-correction pulse width D0 is corrected in accordance with the correction function f. This pulse width will be called a post-correction pulse width hereinafter. As illustrated in FIG. 7, the width (dose command value) of a pulse forming a dose pattern does not have a linear relationship with the line width of an actually formed resist pattern. To obtain the target line width, it is necessary to correct the pre-correction pulse width D0 in accordance with the correction function f illustrated in FIG. 8.

The correction function f is given by:

$$D1 = f(D0) \quad (1)$$

D0: pre-correction pulse width (pre-correction dose command value)
D1: post-correction pulse width (post-correction dose command value)

Figure 18:
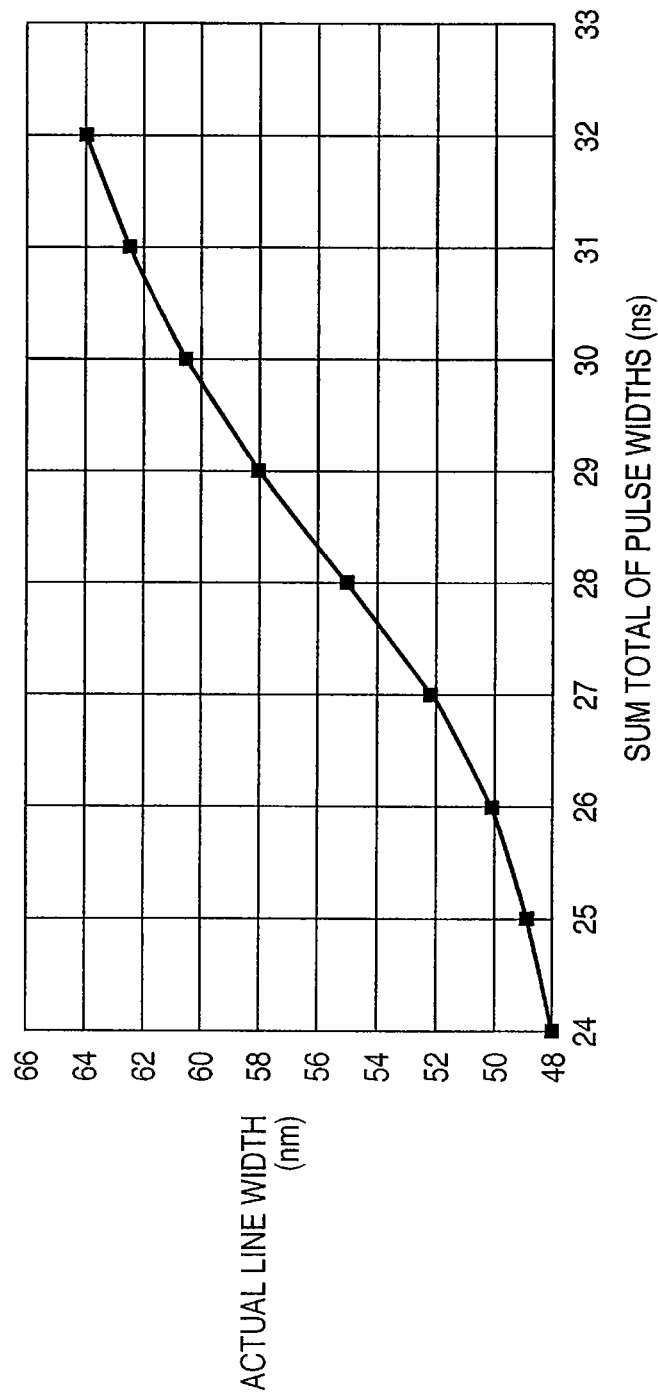
FIG. 18 is a graph when the abscissa as the measurement result illustrated in FIG. 7 is replaced by the sum total of the widths of a plurality of pulses which form a dose pattern.
Figure 19:
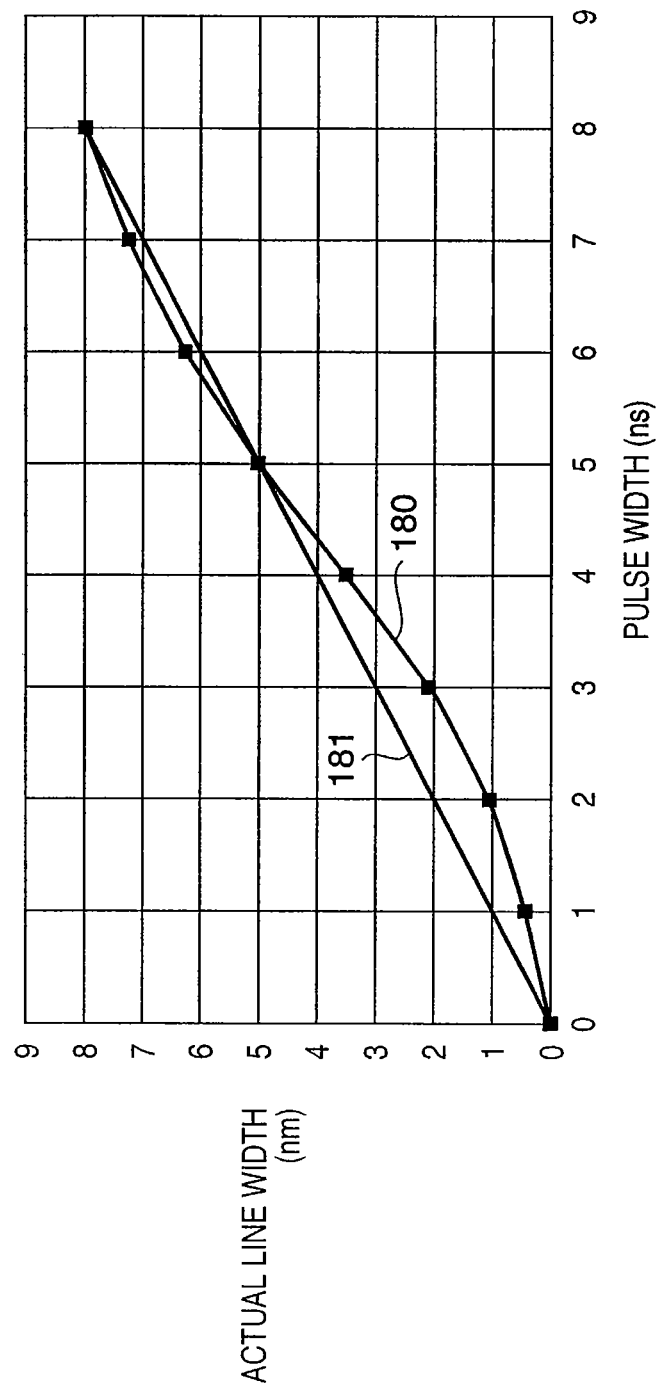
FIG. 19 is a graph when the abscissa of FIG. 18 is replaced by the width of the fourth pulse and the ordinate of FIG. 18 is replaced by the line width of a pattern formed by the fourth pulse.

The correction function f can be generated in the following way. FIG. 18 is a graph when the abscissa as the measurement result illustrated in FIG. 7 is replaced by the sum total of the widths of a plurality of pulses forming a dose pattern. As described above, in this embodiment, a time period of 1 ns corresponds to a line width of 2 nm. FIG. 19 is a graph when the abscissa of FIG. 18 is replaced by the width of the fourth pulse and the ordinate of FIG. 18 is replaced by the line width of a pattern formed by the fourth pulse. A curve 180 indicates an actual line width. In this embodiment, as illustrated in FIG. 4, four pulses form a dose pattern, and its line width is finely adjusted by changing the width of the fourth pulse. It is possible to obtain the correction function f shown in FIG. 8 by adding the difference between the curve 180 and a straight line 181 to the value of a straight line 81.

Figure 20:
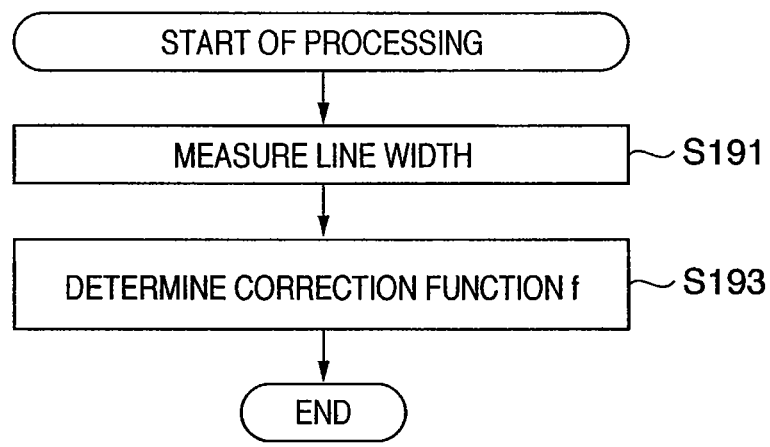
FIG. 20 is a flowchart illustrating an example of a correction function determination method according to the preferred embodiment of the present invention.

FIG. 20 is a flowchart illustrating an example of a correction function determination method according to the preferred embodiment of the present invention. This method is performed under the control of the main control system 26. In step S191, the main control system 26 uses the semiconductor detector 14 to measure, in accordance with the method explained with reference to FIG. 17, the relationship between a dose pattern and the line width of a resist pattern formed in accordance with it.

In step S193, the main control system 26 determines a correction function f in accordance with the above-described method, based on the result measured in step S191. After determining the correction function f, the electron beam exposure apparatus completes calibration.

To draw a pattern on the wafer, a post-correction pulse width D1 may be determined in accordance with the correction function f shown in FIG. 8 by setting, as a pre-correction pulse width D0, the width of the fourth pulse of the dose pattern illustrated in FIG. 4. This makes it possible to correct the pulse width D0, thereby obtaining a pattern having the target line width.

Figure 9:
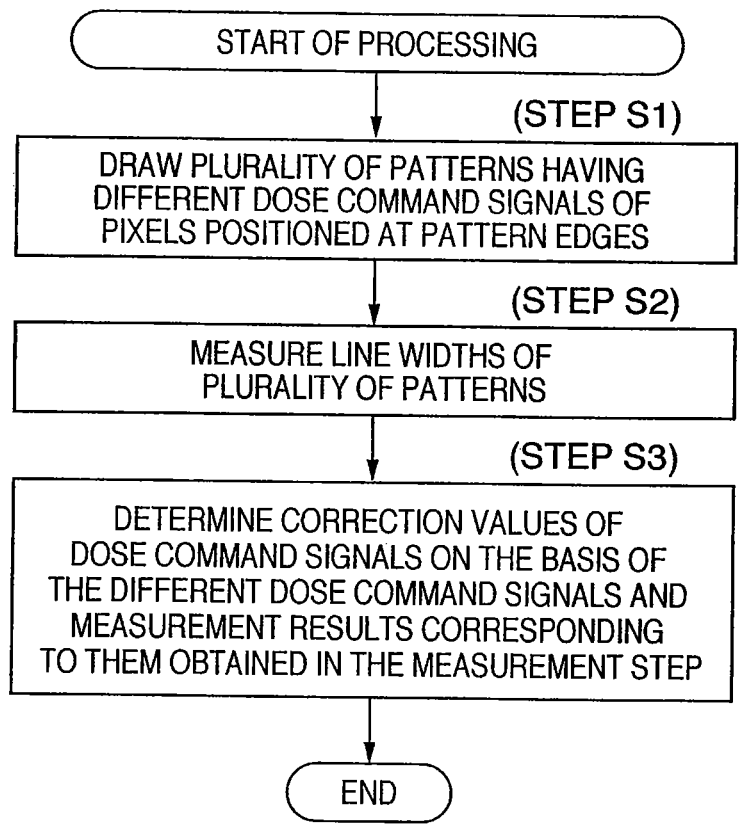
FIG. 9 is a flowchart illustrating a method of determining a correction function of the pulse width (dose command value) according to the embodiment of the present invention.

FIG. 9 is a flowchart representing the correction function determination method from another viewpoint. In step S1, an electron beam (charged particle beam) scans the semiconductor detector 14 in accordance with a plurality of dose patterns having different pulse widths (dose command values) of pixels (corresponding to pulses of the "fourth shot" in FIG. 4) positioned at the pattern edges.

In step S2, the pattern line width is measured based on the measurement result of the amount of charged particle beam of each of the plurality of dose patterns.

In step S3, a pulse width correction function is determined based on the different pulse widths (dose command values) and the measurement results corresponding to them. The electron beam exposure apparatus completes calibration. To draw a pattern on the wafer, a post-correction pulse width D1 may be determined in accordance with the correction function f shown in FIG. 8 by setting, as a pre-correction pulse width D0, the width of the fourth pulse of the dose pattern illustrated in FIG. 4. This makes it possible to correct the pulse width D0, thereby obtaining a pattern having the target line width.

Figure 10:
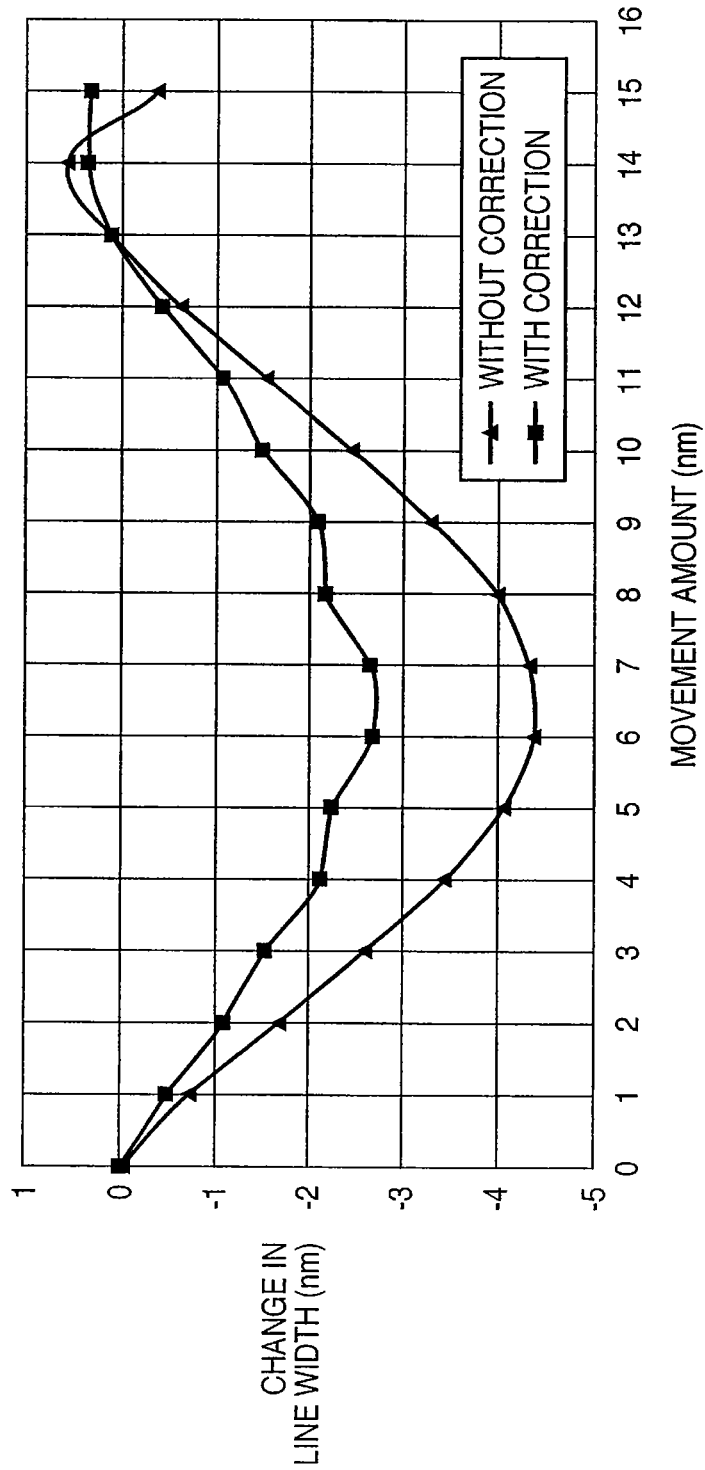
FIG. 10 is an explanatory graph for explaining the dose pattern correction result according to the embodiment of the present invention.

FIG. 10 shows a practical example of a result of correcting the dose pattern shown in FIG. 4, using the above-described correction function. The ordinate of FIG. 10 indicates a change in line width, and the abscissa of FIG. 10 indicates the pattern movement amount.

As illustrated in FIG. 10, a change in dose pattern (exposure time) is preferably small even when, e.g., the pattern movement amount increases.

The result shows that the line width greatly changes if a dose command signal is not corrected, while it slightly changes if this signal is corrected, as shown in FIG. 10.

That is, if no correction is performed as in the conventional case, even though a dose must be controlled in accordance with the command value, the actual dose does not exactly follow the command value.

However, in the charged particle beam drawing method according to this embodiment, the command value is corrected in the above way to obtain a corresponding dose. Obviously, this decreases a change in line width due to the pattern movement to improve the reliability of pattern formation.

That is, in the charged particle beam drawing method according to this embodiment, the line width of the charged particle beam is efficiently measured and corrected. This makes it possible to easily draw a required micropattern and improve the efficiency and reliability in drawing a required pattern.

The exposure apparatus (electron beam exposure apparatus) according to this embodiment adopts the charged particle beam drawing method. This allows a required exposure process, an improvement in the yield upon exposing a micropattern, and an improvement in the efficiency and reliability of the exposure process.

(Embodiment of Device Manufacturing Method)

An embodiment of a device manufacturing method using the above-described electron beam exposure apparatus will be described next. FIG. 11 shows a sequence for manufacturing a microdevice (e.g., a semiconductor chip such as an IC or an LSI, a liquid crystal panel, a CCD, a thin-film magnetic head, or a micromachine).

In step 4 (circuit design), the circuit of a semiconductor device is designed. In step 5 (EB data conversion), exposure control data of the exposure apparatus is generated on the basis of the designed circuit pattern.

In step 6 (wafer manufacture), a wafer is manufactured using a material such as silicon.

In step 7 (wafer process) called a preprocess, an actual circuit is formed on the wafer by lithography using the wafer and the exposure apparatus which has received the prepared exposure control data.

In step 8 (assembly) called a post-process, a semiconductor chip is formed from the wafer manufactured in step 7. This step includes processes such as assembly (dicing and bonding) and packaging (chip encapsulation).

In step 9 (inspection), inspections including operation check test and durability test of the semiconductor device manufactured in step 8 are performed.

A semiconductor device is completed with these processes and shipped in step 10.

Figure 12:
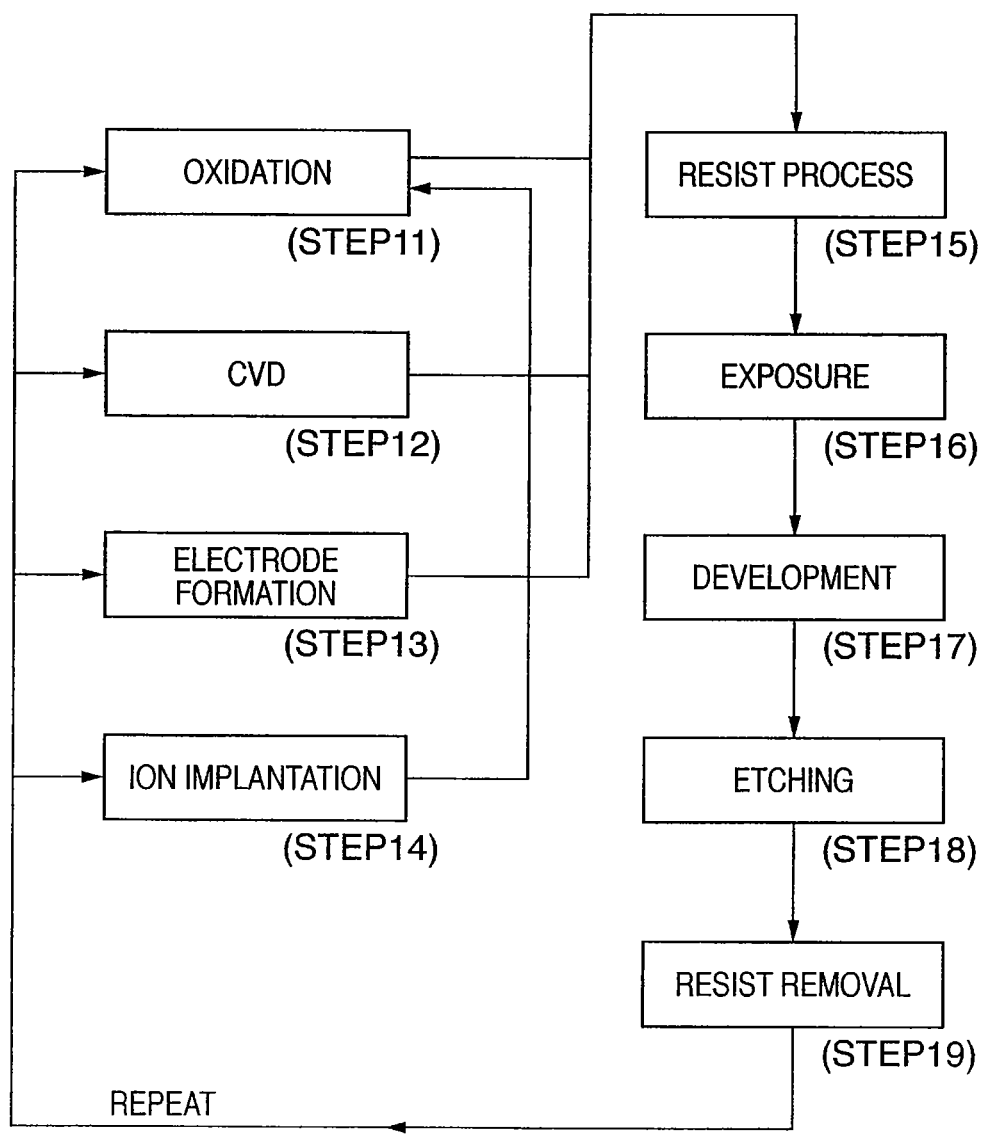
FIG. 12 is a flowchart illustrating details of the wafer process (step 7) in the flowchart shown in FIG. 11.
Figure 13:
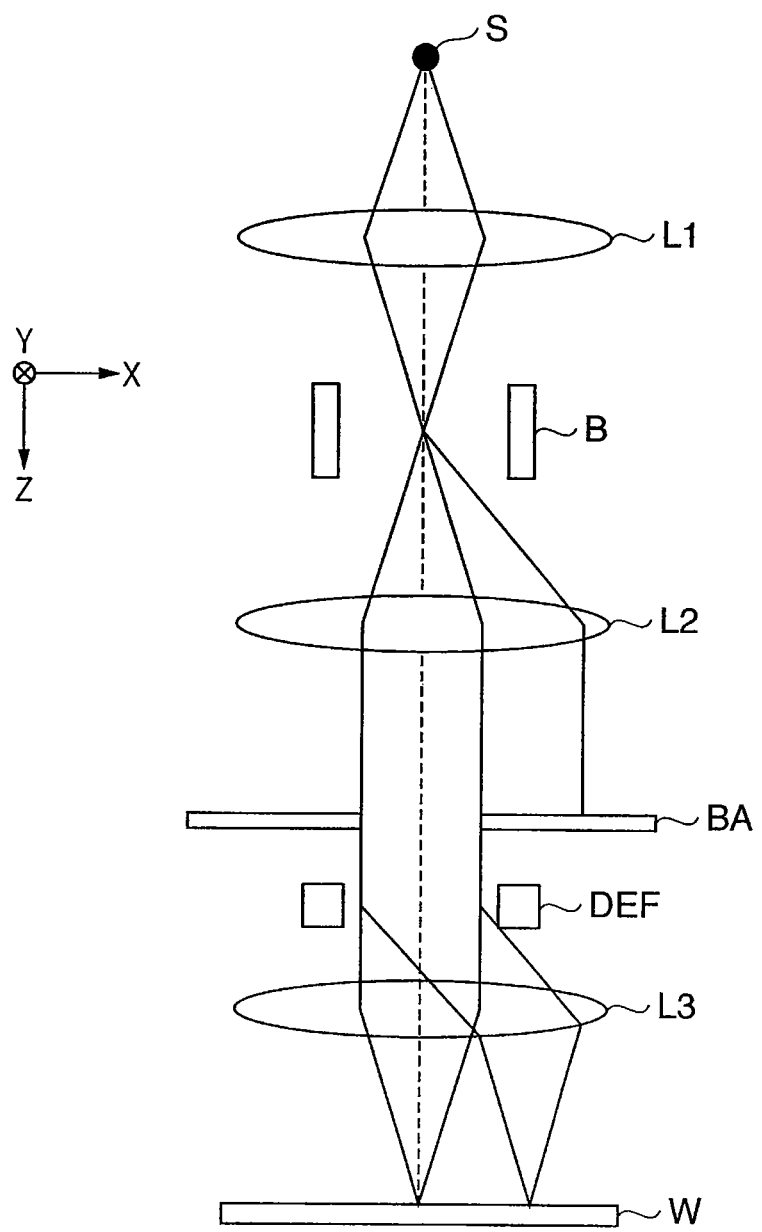
FIG. 13 is an explanatory view for explaining a conventional raster scanning type electron beam exposure apparatus.
Figures 15A, 15B:
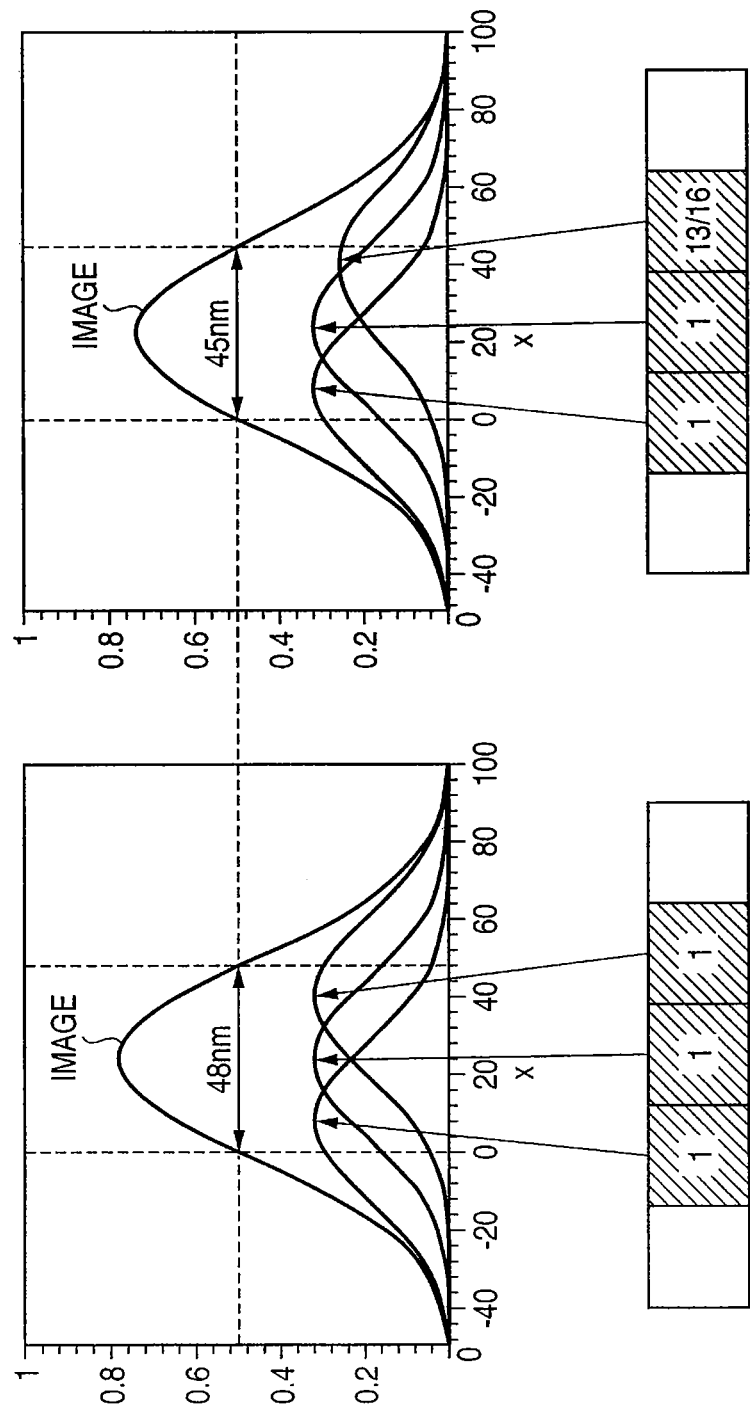
FIGS. 15A and 15B are explanatory graphs for explaining conventional line width control.

FIG. 12 shows the detailed sequence of the wafer process (step 7). In step 11 (oxidation), the surface of the wafer is oxidized. In step 12 (CVD), an insulating film is formed on the wafer surface.

In step 13 (electrode formation), an electrode is formed on the wafer by deposition. In step 14 (ion implantation), ions are implanted into the wafer. In step 15 (resist process), a photosensitive agent is applied to the wafer.

In step 16 (exposure), the above-described exposure apparatus prints the circuit pattern on the wafer by exposure. In step 17 (development), the exposed wafer is developed. In step 18 (etching), portions other than the developed resist image are etched.

In step 19 (resist removal), any unnecessary resist remaining after etching is removed. By repeating these steps, a multilayered structure of circuit patterns is formed on the wafer.

From the results described above, the device manufacturing method according to this embodiment adopts the above-described electron beam exposure apparatus. This makes it possible to improve the manufacturing yield and increase the efficiency and reliability of microfabrication.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-169797, filed Jun. 20, 2006, which is hereby incorporated by reference herein in its entirety.

What is claimed is:

1. An apparatus for drawing a pattern on a substrate with a charged particle beam, the apparatus comprising:
   an optical system;
   a detector including a shielding member, having an edge, for shielding the charged particle beam and configured to detect the charged particle beam without being shielded by the shielding member; and
   a controller configured to cause, in accordance with each of a plurality of dose value sets respectively corresponding to a plurality of target line widths in a predetermined direction, the optical system to draw a pattern on the detector with the charged particle beam with respect to each of a plurality of relative positions between the pattern and the detector in the predetermined direction, to cause the detector to detect an amount of the charged particle beam with respect to each of the plurality of relative positions, to attain a change in the detected amount with each change in the plurality of relative positions with respect to each of the plurality of dose value sets to obtain a line width corresponding to each of the plurality of dose value sets, and to calibrate the plurality of dose value sets based on the plurality of target line widths and the obtained line widths corresponding thereto.

2. The apparatus according to claim 1, wherein the controller is configured to calibrate the plurality of dose value sets by obtaining a function for converting one of the plurality of dose value sets to one of the calibrated plurality of dose value sets.

3. The apparatus according to claim 1, further comprising a stage configured to hold the substrate and to be moved, wherein the detector is arranged on the stage.

4. The apparatus according to claim 1, wherein the plurality of dose value sets are different from each other in a dose value for a pixel of the pattern at an end in the predetermined direction.

5. The apparatus according to claim 1, wherein the controller is configured to obtain the line width by applying a slice level to a dose distribution obtained from the changes, in the detected amounts with the changes in the plurality of relative positions, attained with respect to each of the plurality of does value sets.

6. A method of manufacturing a device, the method comprising:
   drawing a pattern on a substrate using an apparatus defined in claim 1;
   developing the substrate on which the pattern has been drawn; and
   processing the developed substrate to manufacture the device.

7. A calibration method of calibrating a dose value set used by an apparatus for drawing a pattern on a substrate with a charged particle beam, the method comprising:
   causing, in accordance with each of a plurality of dose value sets respectively corresponding to a plurality of target line widths in a predetermined direction, an optical system to draw a pattern on a detector, that includes a shielding member, having an edge, for shielding the charged particle beam, with the charged particle beam with respect to each of a plurality of relative positions between the pattern and the detector in the predetermined direction, and causing the detector to detect an amount of the charged particle beam, without being shielded by the shielding member, with respect to each of the plurality of relative positions;
   attaining a change in the detected amount with each change in the plurality of relative positions with respect to each of the plurality of dose value sets to obtain a line width corresponding to each of the plurality of dose value sets; and
   calibrating the plurality of dose value sets based on the plurality of target line widths and the obtained line widths corresponding thereto.

8. The method according to claim 7, wherein the line width is obtained by applying a slice level to a dose distribution obtained from the changes, in the detected amounts with the changes in the plurality of relative positions, attained with respect to each of the plurality of does value sets.

9. An apparatus for drawing a pattern on a substrate with a charged particle beam, the apparatus comprising:
   an optical system;
   a detector including a shielding member, having an edge, for shielding the charged particle beam and configured to detect the charged particle beam without being shielded by the shielding member; and a controller configured to cause, in accordance with a dose value set corresponding to a target line width in a predetermined direction, the optical system to draw a pattern on the detector with the charged particle beam with respect to each of a plurality of relative positions between the pattern and the detector in the predetermined direction, to cause the detector to detect an amount of the charged particle beam with respect to each of the plurality of relative positions, to attain a change in the detected amount with each change in the plurality of relative positions to obtain a line width corresponding to the dose value set.

10. A method of obtaining a line width corresponding to a dose value set used by an apparatus for drawing a pattern on a substrate with a charged particle beam, the method comprising:

causing, in accordance with a dose value set corresponding to a line width in a predetermined direction, an optical system to draw a pattern on a detector, that includes a shielding member, having an edge, for shielding the charged particle beam, with the charged particle beam with respect to each of a plurality of relative positions between the pattern and the detector in the predetermined direction, and causing a detector to detect an amount of the charged particle beam, without being shielded by the shielding member, with respect to each of the plurality of relative positions; and attaining a change in the detected amount with each change in the plurality of relative positions to obtain a line width corresponding to the dose value set.

* * * * *